(12) United States Patent
Chen et al.

(10) Patent No.: US 8,086,919 B2
(45) Date of Patent: Dec. 27, 2011

(54) CONTROLLER HAVING FLASH MEMORY TESTING FUNCTIONS, AND STORAGE SYSTEM AND TESTING METHOD THEREOF

(75) Inventors: Ban-Hui Chen, Hsinchu County (TW); Wei-Chen Teo, Hsinchu County (TW); Min-Cheng Wang, Miaoli (TW)

(73) Assignee: Phison Electronics Corp., Miaoli (TW)

( * ) Notice: Subject to any disclaimer, the term of this patent is extended or adjusted under 35 U.S.C. 154(b) by 249 days.

(21) Appl. No.: 12/470,799

(22) Filed: May 22, 2009

(65) Prior Publication Data

US 2010/0241914 A1    Sep. 23, 2010

(30) Foreign Application Priority Data

Mar. 20, 2009 (TW) .............................. 98109170 A

(51) Int. Cl.
*G11C 29/00* (2006.01)
(52) U.S. Cl. ........................ 714/723; 714/763
(58) Field of Classification Search .................. 714/718, 714/723, 763
See application file for complete search history.

(56) References Cited

U.S. PATENT DOCUMENTS

| | | | | |
|---|---|---|---|---|
| 5,864,661 A * | 1/1999 | Ohara | ............................. | 714/42 |
| 5,896,331 A * | 4/1999 | Crafts | ........................... | 365/201 |
| 5,928,370 A * | 7/1999 | Asnaashari | ..................... | 714/48 |
| 5,963,473 A * | 10/1999 | Norman | ................... | 365/185.02 |
| 6,226,202 B1 * | 5/2001 | Kikuchi | ................... | 365/185.33 |
| 7,242,615 B2 * | 7/2007 | Nagashima | .............. | 365/185.09 |
| 7,308,567 B2 * | 12/2007 | Yamamoto et al. | ................ | 713/1 |
| 7,366,825 B2 * | 4/2008 | Williams et al. | .............. | 711/103 |
| 7,447,936 B2 * | 11/2008 | Shiota et al. | ................... | 714/6.1 |
| 7,480,762 B2 * | 1/2009 | Eggleston et al. | ............. | 711/103 |
| 7,650,541 B2 * | 1/2010 | Roohparvar | ................... | 714/723 |
| 7,793,035 B2 * | 9/2010 | Oshima et al. | ................ | 711/103 |
| 7,849,382 B2 * | 12/2010 | Kasahara et al. | .............. | 714/763 |
| 7,873,885 B1 * | 1/2011 | Shin et al. | ...................... | 714/724 |

* cited by examiner

*Primary Examiner* — James C Kerveros
(74) *Attorney, Agent, or Firm* — J.C. Patents

(57) ABSTRACT

A flash memory controller having a flash memory testing functions is provided, in which the flash memory controller includes a microprocessor unit, a flash memory interface unit, a host interface unit and a memory cell testing unit. The flash memory interface unit is configured for connecting a plurality of flash memory chips, where each flash memory chip has a plurality of flash memory dies and each flash memory die has a plurality of physical blocks. The host interface unit is configured for connecting a host system. The memory cell testing unit is configured for determining whether the physical blocks can be normally written, read and erased. Accordingly, the flash memory controller can perform a flash memory testing under a command of the host system and all the physical blocks of the flash memory chip can be tested during the flash memory testing.

23 Claims, 3 Drawing Sheets

CONTROLLER HAVING FLASH MEMORY TESTING FUNCTIONS, AND STORAGE SYSTEM AND TESTING METHOD THEREOF

CROSS-REFERENCE TO RELATED APPLICATION

This application claims the priority benefit of Taiwan application serial no. 98109170, filed Mar. 20, 2009. The entirety of the above-mentioned patent application is hereby incorporated by reference herein and made a part of specification.

BACKGROUND

1. Technology Field

The present invention relates to a flash memory controller having flash memory testing functions and a flash memory testing method.

2. Description of Related Art

The growth of digital cameras, mobile phones, and MP3 players has been rapid in recent years. Consequently, the consumers' demand for storage media has increased tremendously. Flash memory has the characteristics of data non-volatility, low power consumption, compact size, and non-mechanical structure. Hence, flash memory is adapted for portable appliances, especially portable products powered by batteries. A solid state drive (SSD) is a storage apparatus adopting NAND flash memory as storage medium.

The flash memory chip of the flash memory storage apparatus includes one or a plurality of flash memory die(s) according to the volume designed. Moreover, the flash memory dies are divided into a plurality of physical blocks for data storage. Generally, after the flash memory storage apparatus has been manufactured, the vendor performs a reading and writing test to the physical blocks of the flash memory storage apparatus to ensure the quality of the flash memory storage apparatus.

When performing the reading and writing test to the flash memory storage apparatus, in the conventional method the flash memory storage apparatus is connected to a host system (e.g. a computer) installed with a testing software. Then, the testing software is performed to write a testing datum in the flash memory storage apparatus and read the testing datum from the flash memory storage apparatus for testing whether the flash memory chip of the flash memory storage apparatus is able to store data normally.

In general, the physical blocks are logically grouped into a system area, a data area, a spare area, and a replacement area by the flash memory controller of the flash memory storage apparatus. The physical blocks in the system area are configured to store important relevant information of the flash memory storage apparatus. On the other hand, the physical blocks in the replacement area are configured to replace the damaged physical blocks in the data area or the spare area. Therefore, in a general access state, the host system cannot access the physical blocks in the system area and the replacement area. The physical blocks in the data area are used for storing valid data written by write commands, and the physical blocks in the spare area are used for substituting the physical blocks in the data area when the write commands are executed. Specifically, when the flash memory storage apparatus receives a write command from the host system to write data into the physical blocks of the data area, the flash memory controller of the flash memory storage apparatus first selects one physical block from the spare area, and then copies the valid old data originally stored in the physical block to be updated in the data area together with the new data to be written into the physical block selected from the spare area. Further, the physical block written with the new data is logically linked to the data area, and the original physical block to be updated in the data area is erased and logically linked to the spare area. To enable the host system to properly access the physical blocks that store data in an alternate manner, the flash memory storage apparatus provides logical blocks to the host system. That is, the flash memory controller of the flash memory storage system records and updates the relationship between the logical blocks and the physical blocks of the data area in a logical address-physical address mapping table to reflect the alternation of the physical blocks. Accordingly, the host system is only required to perform writing to the logical blocks provided and the flash memory controller of the flash memory storage apparatus would read data from or write data into the physical blocks corresponding to the logical address-physical address mapping table.

Due to the operational characteristics of the flash memory storage apparatus aforementioned, the reading and writing test performed by the testing software of the host system to the flash memory storage apparatus cannot ensure all of the physical blocks have been tested.

Furthermore, the flash memory dies in the flash memory chip of the flash memory storage apparatus are managed by the flash memory controller in the flash memory storage system. Therefore, when the reading and writing test is performed to the flash memory storage apparatus, the testing software in the host system must write the testing data according to the relevant specification of the flash memory controller and cannot synchronously execute the writing operation to all of the flash memory dies in the flash memory storage apparatus. Consequently, when the flash memory chip, which is to be tested, in the flash memory storage apparatus is assembled by a plurality of flash memory dies, the conventional testing method requires a lot of time to complete the writing and reading of all of the flash memory dies.

SUMMARY

A flash memory controller having flash memory testing functions, which effectively performs testing to all of the physical blocks of the flash memory chip connected thereto, is provided in an exemplary embodiment of the present invention.

A flash memory testing method that effectively performs testing to all of the physical blocks of the flash memory chip is provided in an exemplary embodiment of the present invention A flash memory storage system that effectively performs testing to all of the physical blocks of the flash memory chip thereof is provided in an exemplary embodiment of the present invention A flash memory controller having flash memory testing functions is provided in an exemplary embodiment of the present invention. The flash memory controller includes a microprocessor unit, a flash memory interface unit, a host interface unit, and a memory cell testing unit. The flash memory interface unit is coupled to the microprocessor unit and configured to connect a plurality of flash memory dies. Additionally, each flash memory die includes a plurality of physical blocks. The host interface unit is coupled to the microprocessor unit and configured to connect to a host system. The memory cell testing unit is coupled to the microprocessor unit, and configured to enable each flash memory die simultaneously and to write a testing datum into each flash memory die simultaneously in a broadcasting manner. Here, the memory cell testing unit reads the testing datum from each of the physical blocks to determine whether each of the physical blocks is a damaged physical block.

A flash memory testing method is provided in an exemplary embodiment of the present invention to test a plurality of flash memory dies, where each of the flash memory dies has a plurality of physical blocks. In this flash memory testing method, a flash memory testing request is sent to a flash memory controller from a host system. The flash memory dies are coupled to the flash memory controller. Moreover, in the flash memory testing method, each of the flash memory dies is simultaneously enabled by the flash memory controller, and a testing datum is simultaneously written into each of the physical blocks of each flash memory die in a broadcasting manner. In addition, the testing datum is read from each of the physical blocks by the flash memory controller to determine whether each of the physical blocks is the damaged physical block.

A flash memory storage system having flash memory testing functions is provided in an exemplary embodiment of the present invention. The storage system includes a connector, a plurality of flash memory dies, and a flash memory controller. The connector is configured to connect with a host system, and each flash memory die includes a plurality of physical blocks. The flash memory controller is coupled to the connector and the flash memory dies. The flash memory controller is configured to enable each of the flash memory dies simultaneously and to write the testing datum into each of the physical blocks of each flash memory die in a broadcasting manner. Moreover, the flash memory controller is configured to read the testing datum from each physical block to determine whether each of the physical blocks is the damaged physical block.

In light of the foregoing, the exemplary embodiments of present invention ensure that all of the physical blocks are tested, and dramatically reduces the time required for testing.

In order to make the aforementioned and other features and advantages of the present invention more comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF EXEMPLARY
EMBODIMENTS

Figure 1:
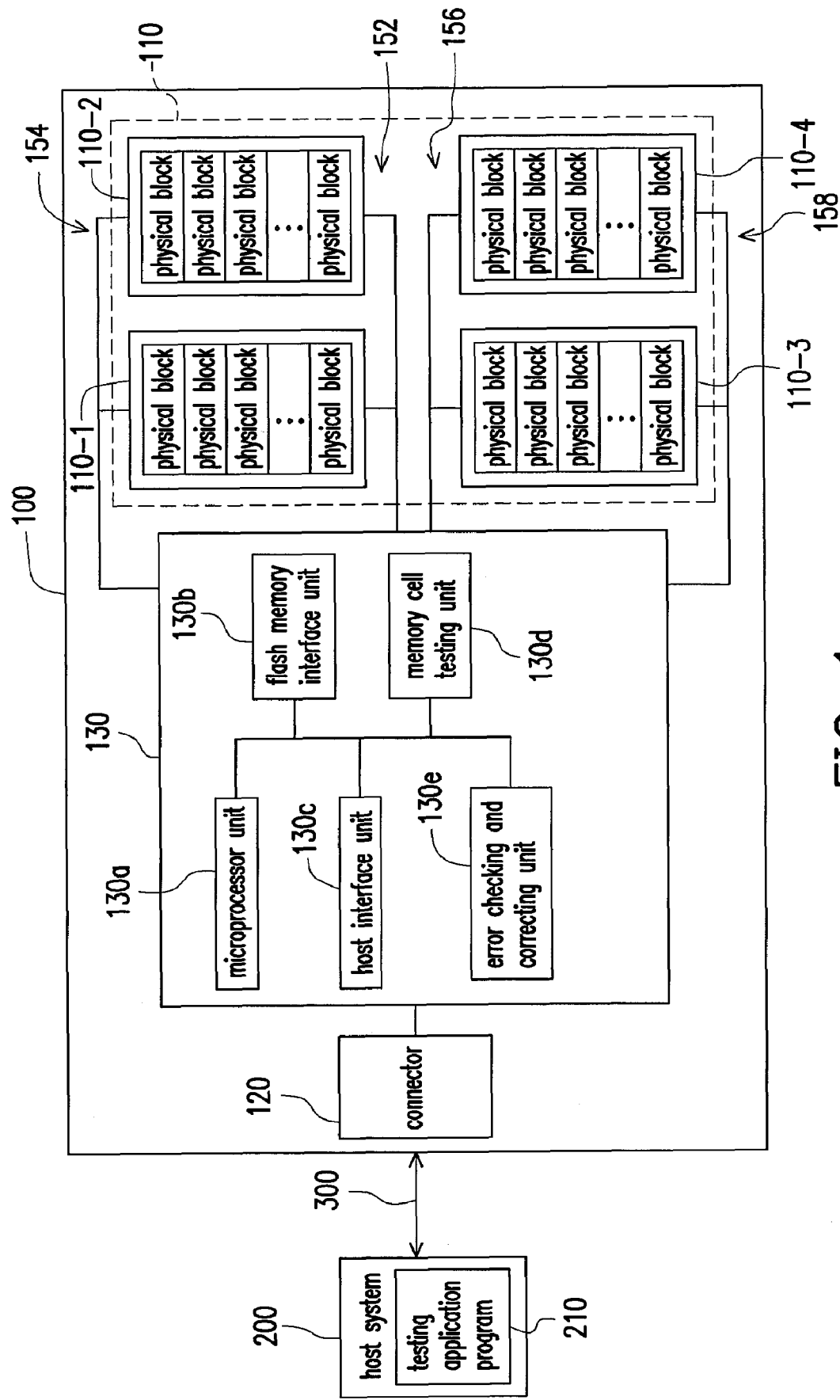
FIG. 1 is a schematic block diagram illustrating a flash memory storage system according to an exemplary embodiment of the present invention.

FIG. 1 is a schematic block diagram illustrating a flash memory storage system according to an exemplary embodiment of the present invention.

Referring to FIG. 1, a flash memory storage system 100 is connected with a host system 200 for the host system 200 to write data into or read data from the flash memory storage system 100. In the present exemplary embodiment, the flash memory storage system 100 is a solid state drive (SSD). However, it should be noted that, in another exemplary embodiment of the present invention, the flash memory storage system 100 is also a memory card or a flash memory drive.

The flash memory storage system 100 includes a flash memory chip 110, a connector 120, and a flash memory controller 130.

The flash memory chip 110 is coupled to the flash memory controller 130 for storing data. According to this exemplary embodiment, the flash memory chip 110 is a multi-level cell (MLC) NAND flash memory chip. Nevertheless, it should be understood that the present invention is not limited thereto. In another exemplary embodiment of the present invention, a single-level cell (SLC) NAND flash memory is also adopted.

Specifically, the flash memory chip 110 includes a flash memory die 110-1, a flash memory die 110-2, a flash memory die 110-3, and a flash memory die 110-4. The flash memory die 110-1 and the flash memory die 110-2 are coupled to the flash memory controller 130 through a data bus 152 and a control bus 154. On the other hand, the flash memory die 110-3 and the flash memory die 110-4 are coupled to the flash memory controller 130 through a data bus 156 and a control bus 158. Besides, the flash memory die 110-1, the flash memory die 110-2, the flash memory die 110-3, and the flash memory die 110-4 are each divided into a plurality of physical blocks. It must be understood that in the present exemplary embodiment, the flash memory chip 110 including four flash memory dies is used as an example for illustration. However, the present invention is not limited thereto, and can adopt a flash memory chip having a random number of flash memory dies.

Each of the physical blocks is usually partitioned into a plurality of pages, e.g., 64 pages, 128 pages, and 256 pages. Generally, one page is the minimum unit for programming. That is, one page is the minimum unit for writing or reading data. However, it needs to be pointed out that, in different kinds of flash memory designs, the minimum unit for programming is also a sector (i.e. one page includes a plurality of sectors, and one sector is the minimum unit for programming). Each of the pages usually includes a user data area D and a redundancy area R. The user data area D is configured for storing user data, and the redundancy area R is configured for storing system data (for example, an error checking and correcting code (ECC code)). Generally speaking, the user data area D is usually 512 bytes and the redundancy area R is usually 16 bytes, so as to correspond to a size of the sector of a disc drive. In other words, one page address is one sector. However, one page address can also be constituted by a plurality of sectors. In this exemplary embodiment, each of the pages includes four sectors.

The connector 120 is coupled to the flash memory controller 130 and for connecting with the host system 200 via a bus 300. In the present exemplary embodiment, the connector 120 is a Serial Advanced Technology Attachment (SATA) connector. However, the present invention is not limited thereto, and the connector 120 can also be a Universal Serial Bus (USB) connector, an Institute of Electrical and Electronics Engineers (IEEE) 1394 connector, a Peripheral Component Interconnect (PCI) Express connector, an Memory Stick (MS) connector, an Multi Media Card (MMC) connector, an Secure Digital (SD) connector, a Compact Flash (CF) connector, an Integrated Drive Electronics (IDE) connector, or other suitable connectors.

The flash memory controller 130 executes a plurality of logical gates or mechanical commands which are implemented in a hardware form or firmware form, so as to coordinate with the connector 120 and the flash memory chip 110 for writing, reading, or erasing data. Especially, the flash memory controller 130 has a function of testing the flash memory chip 110. More specifically, in the present exemplary embodiment, the host system 200 includes a testing application program 210. In particular, the host system 200 executes the testing application program 210 to command the flash memory controller 130 to test whether the physical blocks of the flash memory chip 110 can be read, written, and erased normally.

The flash memory controller 130 includes a microprocessor unit 130a, a flash memory interface unit 130b, a host interface unit 130c, and a memory cell testing unit 130d.

The microprocessor unit 130a is configured to control the overall operation of the flash memory controller 130. That is, the operation of all of the components within the flash memory controller 130 is controlled by the microprocessor unit 130a.

The flash memory interface unit 130b is coupled to the microprocessor unit 130a for accessing the flash memory chip 110. In other words, the data to be written into the flash memory chip 110 is transformed to a format acceptable by the flash memory chip 110 via the flash memory interface unit 130b.

The host interface unit 130c is coupled to the microprocessor unit 130a for receiving and identifying commands transmitted by the host system 200. In other words, the commands and data transmitted by the host system 200 are transmitted to the microprocessor unit 130a via the host interface unit 130c. In the present exemplary embodiment, the host interface unit 130c is a Serial Advanced Technology Attachment (SATA) interface. However, it should be understood that the present invention is not limited thereto. The host interface unit 130c can also be a Universal Serial Bus (USB) interface, an Institute of Electrical and Electronics Engineers (IEEE) 1394 interface, a Peripheral Component Interconnect (PCI) Express interface, an Memory Stick (MS) interface, an Multi Media Card (MMC) interface, an Secure Digital (SD) interface, a Compact Flash (CF) interface, an Integrated Drive Electronics (IDE) interface, or other types of interfaces suitable for data transmission. It should be noted that the host interface unit 130c must correspond to the connector 120. That is to say, the host interface unit 130c needs to be disposed in coordination with the connector 120.

The memory cell testing unit 130d is coupled to the microprocessor unit 130a for testing the physical blocks of the flash memory die 110-1, the flash memory die 110-2, the flash memory die 110-3, and the flash memory die 110-4 to determine whether damaged (or impaired) physical blocks are presented in the flash memory dies 110-1, 110-2, 110-3, and 110-4.

For example, in one exemplary embodiment of the present invention, the memory cell testing unit 130d writes a testing datum into each of the physical blocks of the flash memory die 110-1, the flash memory die 110-2, the flash memory die 110-3, and the flash memory die 110-4. The memory cell testing unit 130d then determines whether each of the physical blocks can be written or read normally by reading the testing datum. Moreover, in another exemplary embodiment of the present invention, the memory cell testing unit 130d further generates a plurality of physical addresses to be written according to an identification code of the flash memory die 110-1, the flash memory die 110-2, the flash memory die 110-3, and the flash memory die 110-4, and writes the testing datum into each of the physical blocks according to the physical addresses generated.

Additionally, in one exemplary embodiment of the present invention, the flash memory controller 130 further includes an error checking and correcting unit 130e. The error checking and correcting unit 130e is configured to generate the corresponding error checking and correcting code according to the datum to be written into the flash memory chip 110. The error checking and correcting unit 130e further checks the accuracy of the datum read according to the corresponding error checking and correcting code. The error checking and correcting unit is well-known to those skilled in the art, and the operation thereof is thus not illustrated herein. Accordingly, according to the error checking and correcting code corresponding to the testing datum, the memory cell testing unit 130d can inspect whether the testing datum has been written into each of the physical blocks of the flash memory die 110-1, the flash memory die 110-2, the flash memory die 110-3, and the flash memory die 110-4 correctly or whether the testing datum has been read from each of the physical blocks of the flash memory die 110-1, the flash memory die 110-2, the flash memory die 110-3, and the flash memory die 110-4 correctly, or whether each of the physical blocks of the flash memory die 110-1, the flash memory die 110-2, the flash memory die 110-3, and the flash memory die 110-4 has been erased correctly.

It should be noted that in one exemplary embodiment of the present invention, when the memory cell testing unit 130d executes the testing to the flash memory chip 110, the memory cell testing unit 130d enables the flash memory die 110-1, the flash memory die 110-2, the flash memory die 110-3, and the flash memory die 110-4 simultaneously via the control bus 154 and the control bus 158, and writes the testing datum into each of the physical blocks of the flash memory die 110-1, the flash memory die 110-2, the flash memory die 110-3, and the flash memory die 110-4 simultaneously. Especially, in the present exemplary embodiment, as the operation of testing the flash memory chip 110 is executed by the flash memory controller 130, the flash memory controller 130 can simultaneously enable the flash memory die 110-1, the flash memory die 110-2, the flash memory die 110-3, and the flash memory die 110-4 for writing the testing data simultaneously. It should be noted that in another exemplary embodiment of the present invention, the flash memory storage system 100 can also be disposed only with a single control bus (that is, the control bus 154 and the control bus 158 are the same control bus). The flash memory storage system 100 then enables all of the flash memory dies in the flash memory chip with this control bus.

In addition, the memory cell testing unit 130d establishes an error list to record the test result upon completion of the test for the flash memory chip 110. Specifically, when the memory cell testing unit 130d detects the damaged physical blocks in the flash memory chip 110 during the testing process, the memory cell testing unit 130d then establishes the error list for recording the relevant information of each of the damaged physical blocks.

Figure 2:
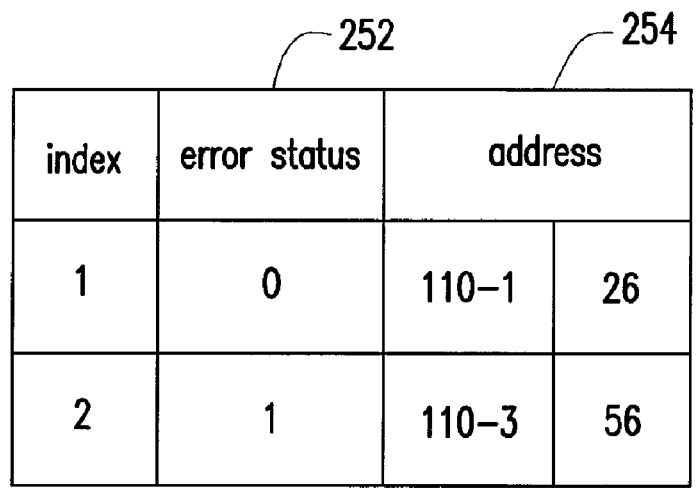
FIG. 2 is a schematic data structural diagram illustrating an error list according to an exemplary embodiment of the present invention.

FIG. 2 is a schematic data structural diagram illustrating an error list according to an exemplary embodiment of the present invention.

Referring to FIG. 2, an error list 250 includes an error status column 252 and an address column 254.

The error status column 252 is configured to record the error type of the damaged physical block. For instance, in the present exemplary embodiment, the error status column 252 records whether the abnormal status of the damaged physical block is a writing error, a reading error, or an erasing error. To give an example, in the error status column 252, an input of 0 represents a writing error, 1 represents a reading error, and 2 represent an erasing error. The address column 254 is configured to record the address of the damaged physical block. For example, the address column 254 includes two sub-columns that respective record which flash memory die and which physical block the damaged physical block belongs to. For instance, as illustrated in the exemplary embodiment shown in FIG. 2, where two erroneous damaged physical blocks are recorded. The first error is a writing error, and the damaging address is at the $26^{th}$ physical block of the flash memory die 110-1. The second error is a reading error, and the damaging address is at the $56^{th}$ physical block of the flash memory die 110-3.

It should be noted that in another exemplary embodiment of the present invention, the memory cell testing unit 130d not only transmits the established error list 250 to the testing application program 210 of the host system 200, but also stores the error list 250 in the undamaged physical blocks of the flash memory chip 110. Therefore, the relevant test results of the flash memory chip 110, which has been tested, can be read by other host systems. For instance, when the testing engineer has completed the testing of the flash memory chip 110 with the testing application program 210 of the host system 200, the testing engineer can further perform testing procedures of other flash memory chips while the other engineers can read the test results, which are stored in the tested flash memory chip 110, in other host systems, so as to execute the following procedures such as the execution of error analysis.

Moreover, in the process of the memory cell testing unit 130d executing the testing to the flash memory chip 110, the testing application program 210 of the host system 200 can continuously perform polling to get a current testing status (i.e. a testing progress). To give an example, the testing application program 210 sends the flash memory testing report request to the memory cell testing unit 130d via the relevant command (i.e. the vendor command) in the testing process to request for the feedback of the current testing status. Here, the tester can decide whether to terminate the testing or not.

For instance, when the memory cell testing unit 130d received the flash memory testing report request from the testing application program 210 of the host system 200, the memory cell testing unit 130d dynamically transmits the testing status message to the testing application program 210 of the host system 200. Thus, the tester can decide whether to terminate the testing or not based on the current testing status. Especially, when the testing application program 210 sends the flash memory testing report request to request for the current testing status, the memory cell testing unit 130d of the flash memory controller 130 needs not to pause the testing for the sake of responding the testing status and can continue the testing performed on the physical blocks.

Figure 3:
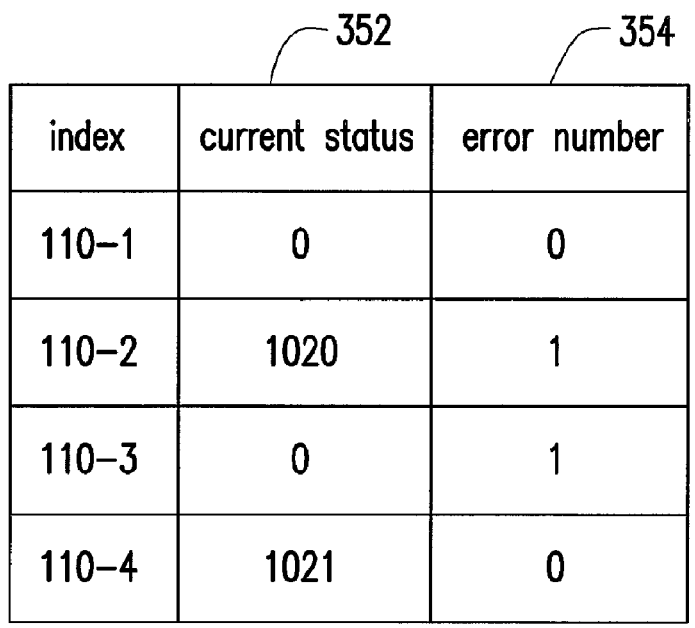
FIG. 3 is a schematic data structural diagram illustrating a testing status message according to an exemplary embodiment of the present invention.

FIG. 3 is a schematic data structural diagram illustrating a testing status message according to an exemplary embodiment of the present invention.

Referring to FIG. 3, a testing status message 350 includes a current status column 352 and an error number column 354.

The current status column 352 records a testing progress of each of the flash memory dies. For example, the current status column 352 records the completion of the test or the physical block that is being tested presently. To give an example, in the current status column 352, an input of 0 represents the completion, and when the current status column 352 has an input of non-0, the testing of a certain physical block is being performed. The error number column 354 records a number of the damaged physical blocks in each of the plurality of flash memory dies. To give an example, as illustrated in the exemplary embodiment of FIG. 3, the flash memory die 110-1 has already finished the test, and the number of damaged physical blocks thereof is 0. The flash memory die 110-2 is currently testing the $1020^{th}$ physical block, where the number of damaged physical blocks thereof is 1. The flash memory die 110-3 has already finished the test, in which the number of damaged physical blocks thereof is 1. Moreover, the flash memory die 110-4 is currently testing the $1021^{st}$ physical block, where the number of the damaged physical blocks is 0.

According to this exemplary embodiment, the memory cell testing unit 130d is implemented in the controller 130 in a firmware form. For instance, relevant mechanical commands can be written by a program language and stored in a program memory (a read only memory (ROM), for example) for implementing the memory cell testing unit 130d. When the flash memory storage system 100 receives the flash memory testing request from the testing application program 210 of the host system 200, a plurality of machine commands of the memory cell testing unit 130d is executed by the microprocessor unit 130a to test the flash memory chip 110. Moreover, in another exemplary embodiment of the present invention, the memory cell testing unit 130d is also implemented in the controller 130 in a hardware form.

Besides, although not shown in the present exemplary embodiment, the flash memory controller 130 can further include general functional devices for controlling the flash memory controller, such as a buffer, a power managing unit module, and the like.

Figure 4:
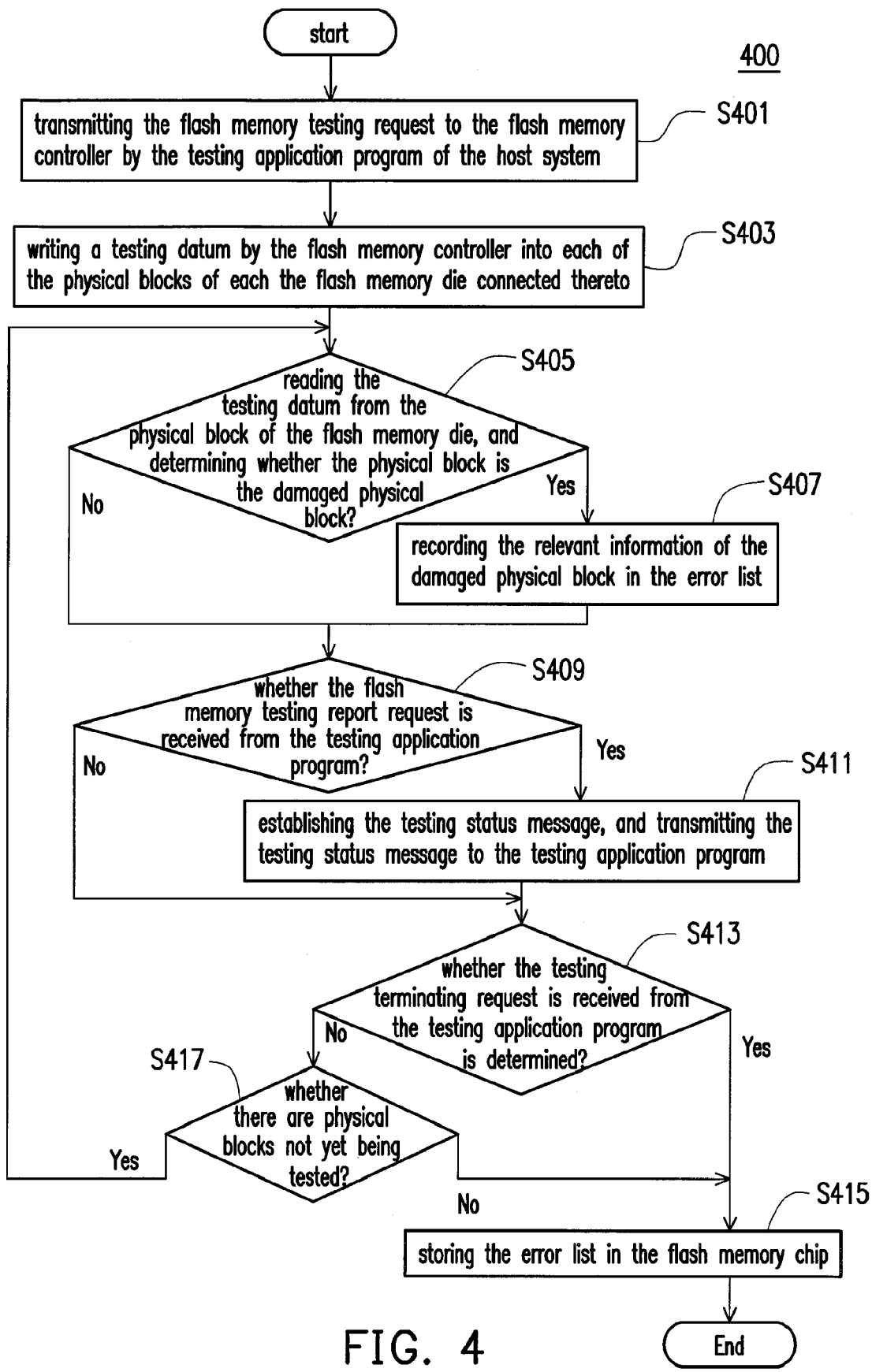
FIG. 4 is a flowchart showing a flash memory testing method according to an exemplary embodiment of the present invention.

FIG. 4 is a flowchart showing a flash memory testing method according to an exemplary embodiment of the present invention.

Referring to FIG. 4, in a testing procedure 400, the flash memory testing request is sent by the testing application program 210 of the host system 200 to the flash memory controller 130 (S401).

Next, when the flash memory controller 130 receives the testing request, a testing datum is written by the flash memory controller 130 into each of the physical blocks of each flash memory die connected thereto (S403). For example, in the present exemplary embodiment, all of the flash memory dies are simultaneously enabled by the flash memory controller 130 via all of the control buses, and the testing data are simultaneously written into all of the flash memory dies in a broadcasting manner. Here, the broadcasting manner is to write the data into all of the flash memory dies simultaneously via the data bus 152 and the data bus 156. It should be noted that in another exemplary embodiment of the present invention, the flash memory storage system 100 can also be disposed only with a single data bus (that is, the data bus 152 and the data bus 156 are the same one). The flash memory storage system 100 then writes the data into all of the flash memory dies via the data bus.

Thereafter, in step S405, the testing data are read from the physical blocks of the flash memory dies to determine whether the physical blocks are the damaged physical blocks. For example, in step S403, when the testing datum is written into one of the physical blocks, the error checking and correcting code is generated according to the testing datum written, and the error checking and correcting code generated is written into the physical block. Next, in step S405, the error checking and correcting code, which is written during the writing operation, can be read, and the error checking and correcting code read is used to determine whether a writing error, a reading error or an erasing error has occurred in the physical block.

If it is determined that there is a damaged physical block in step S405, then the relevant information of the damaged physical block is recorded in the error list (i.e. the error list 250) in step S407.

Furthermore, whether the flash memory testing report request is received from the testing application program 210 is determined in step S409. If the flash memory testing report request is received in step S409, the testing status message (i.e. the testing status message 350) is then established in step S411, and the testing status message is transmitted to the testing application program 210.

In addition, whether a testing termination request is received from the testing application program 210 is determined in step S413. If the testing termination request is received in step S413, the error list is stored in the flash memory chip and the testing procedure 400 is terminated.

Furthermore, whether there are physical blocks not yet being tested is determined in step S417. If there are physical blocks that are not yet being tested, step S405 is returned to. However, if the testing of all of the flash memory dies is completed, step S415 is then executed and the testing procedure 400 is terminated.

In summary, in the present invention, the flash memory controller executes the testing procedure to the flash memory chip according to the command of the host system. Therefore, directly testing is performed to the physical blocks by the flash memory controller to ensure all of the physical blocks are tested. Additionally, in the present invention, the flash memory controller executes the testing procedure. Hence, all of the flash memory dies are enabled simultaneously and are written in the broadcasting manner, thereby reducing the testing time effectively.

Although the present invention has been described with reference to the above exemplary embodiments, it will be apparent to one of the ordinary skill in the art that modifications to the described exemplary embodiment may be made without departing from the spirit of the invention. Accordingly, the scope of the invention will be defined by the attached claims not by the above detailed descriptions.

What is claimed is:

1. A flash memory controller having a flash memory testing function, comprising:
   a microprocessor unit;
   a flash memory interface unit, coupled to the microprocessor unit and configured to connect with a plurality of flash memory dies, wherein each of the plurality of flash memory dies comprises a plurality of physical blocks;
   a host interface unit, coupled to the microprocessor unit and configured to connect with a host system; and
   a memory cell testing unit, coupled to the microprocessor unit, simultaneously enabling each of the flash memory dies, and writing a testing datum into all of the flash memory dies simultaneously via at least one data bus, wherein the memory cell testing unit generates a plurality of physical addresses to be written according to an identification code (ID) of each of the flash memory dies and writes the testing datum into the physical blocks of the plurality of flash memory dies according to the physical addresses,
   wherein the memory cell testing unit reads the testing datum from each of the physical blocks to determine whether each of the physical blocks is a damaged physical block.

2. The flash memory controller having the flash memory testing function as claimed in claim 1, further comprising an error checking and correcting unit, configured to generate an error checking and correcting code according to the testing datum and execute a check and correction to the read testing datum according to the error checking and correcting code,
   wherein the memory cell testing unit determines whether each of the physical blocks is the damaged physical block according to a result of the check and correction.

3. The flash memory controller having the flash memory testing function as claimed in claim 1, wherein the memory cell testing unit dynamically transmits a testing status message to the host system.

4. The flash memory controller having the flash memory testing function as claimed in claim 3, wherein the testing status message comprises:
   a current status column, recording a testing progress of each of the flash memory dies; and
   an error number column, recording a number of the damaged physical blocks in each of the flash memory dies.

5. The flash memory controller having the flash memory testing function as claimed in claim 1, wherein the memory cell testing unit establishes an error list for recording a relevant information of a physical block determined to be the damaged physical block.

6. The flash memory controller having the flash memory testing function as claimed in claim 5, wherein the error list comprises:
   an error status column, recording an error type of the physical block determined to be the damaged physical block; and
   an address column, recording an address of the physical block determined to be the damaged physical block.

7. The flash memory controller having the flash memory testing function as claimed in claim 5, wherein the memory cell testing unit stores the error list in one of the physical blocks.

8. A flash memory testing method configured to test a plurality of flash memory dies, wherein each of the flash memory dies has a plurality of physical blocks, the flash memory testing method comprising:
   sending a flash memory testing request to a flash memory controller by a host system, wherein the flash memory dies are coupled to the flash memory controller; and
   simultaneously enabling each of the flash memory dies with the flash memory controller, writing a testing datum into all of the flash memory dies simultaneously via at least one data bus, and determining whether each of the physical blocks is a damaged physical block by reading the testing datum from each of the physical blocks with the flash memory controller.

9. The flash memory testing method as claimed in claim 8, further comprising establishing an error list by the flash memory controller to record a relevant information of the physical block determined to be the damaged physical block.

10. The flash memory testing method as claimed in claim 9, wherein the establishing of the error list comprises:
    recording an error type of the physical block determined to be the damaged physical block; and
    recording an address of the physical block determined to be the damaged physical block.

11. The flash memory testing method as claimed in claim 9, further comprising storing the error list in one of the physical blocks.

12. The flash memory testing method as claimed in claim 8, wherein the step of simultaneously writing a testing datum into each of the physical blocks of each the flash memory die in a broadcasting manner, and determining whether each of the physical blocks is a damaged physical block by reading the testing datum from each of the physical blocks with the flash memory controller comprises:

generating an error checking and correcting code according to the testing datum;

executing a check and correction to the read testing datum according to the error checking and correcting code; and determining whether each of the physical blocks is the damaged physical block according to a result of the check and correction.

13. The flash memory testing method as claimed in claim 8, wherein the step of writing the testing datum into all of the flash memory dies simultaneously via the at least one data bus comprises:

generating a plurality of physical addresses according to an identification code (ID) of each the flash memory die and writing the testing datum into each of the physical blocks according to the physical addresses.

14. The flash memory testing method as claimed in claim 8, further comprising:

sending a flash memory testing report request to the flash memory controller by the host system, and dynamically establishing and sending a testing status message to the host system by the flash memory controller.

15. The flash memory testing method as claimed in claim 14, wherein the establishing of the testing status message comprises:

recording a current testing progress of each the flash memory die; and recording a number of the damaged physical blocks in each the flash memory die.

16. A flash memory storage system having a flash memory testing function, comprising:

a connector, configured to connect with a host system;

a plurality of flash memory dies, each of the flash memory dies having a plurality of physical blocks; and a flash memory controller, coupled to the connector and the flash memory dies, wherein the flash memory controller is configured for enabling each the flash memory die simultaneously and writing a testing datum into all of the flash memory dies simultaneously via at least one data bus, wherein the flash memory controller reads the testing datum from each of the physical blocks to determine whether each of the physical blocks is a damaged physical block.

17. The flash memory storage system having the flash memory testing function as claimed in claim 16, wherein the flash memory controller generates an error checking and correcting code according to the testing datum, executing a check and correction to the read testing datum according to the error checking and correcting code, and determining whether each of the physical blocks is the damaged physical block according to a result of the check and correction.

18. The flash memory storage system having the flash memory testing function as claimed in claim 16, wherein the flash memory controller generates a plurality of physical addresses to be written according to an identification code (ID) of each the flash memory die, and writes the testing datum into each of the physical blocks according to the physical addresses.

19. The flash memory storage system having the flash memory testing function as claimed in claim 16, wherein the flash memory controller dynamically transmits a testing status message to the host system.

20. The flash memory storage system having the flash memory testing function as claimed in claim 19, wherein the testing status message comprises:

a current status column, recording a testing progress of each the flash memory die; and an error number column, recording a number of the damaged physical blocks in each the flash memory die.

21. The flash memory storage system having the flash memory testing function as claimed in claim 16, wherein the flash memory controller establishes an error list for recording a relevant information of a physical block determined to be the damaged physical block.

22. The flash memory storage system having the flash memory testing function as claimed in claim 21, wherein the error list comprises:

an error status column, recording an error type of the physical block determined to be the damaged physical block; and an address column, recording an address of the physical block determined to be the damaged physical block.

23. The flash memory storage system having the flash memory testing function as claimed in claim 21, wherein the flash memory controller stores the error list in one of the physical blocks.

* * * * *